United States Patent [19]

Noyori et al.

[11] 4,246,595

[45] Jan. 20, 1981

[54] ELECTRONICS CIRCUIT DEVICE AND METHOD OF MAKING THE SAME

[75] Inventors: Masaharu Noyori; Hiroaki Fujimoto, both of Neyagawa, Japan

[73] Assignee: Matsushita Electric Industrial Co., Ltd., Kadoma, Japan

[21] Appl. No.: 882,152

[22] Filed: Feb. 28, 1978

[30] Foreign Application Priority Data

| Mar. 8, 1977 | [JP] | Japan | 52/25603 |
| Apr. 7, 1977 | [JP] | Japan | 52/40022 |
| May 13, 1977 | [JP] | Japan | 52/55624 |
| Sep. 21, 1977 | [JP] | Japan | 52/114296 |
| Sep. 28, 1977 | [JP] | Japan | 52/117068 |

[51] Int. Cl.² .................................. H01L 23/48
[52] U.S. Cl. .................................. 357/70; 357/55; 357/68; 357/69; 357/71
[58] Field of Search .................. 357/55, 68, 69, 70, 357/71

[56] References Cited

U.S. PATENT DOCUMENTS 3,868,724   2/1975   Perrino .................................. 357/70

*Primary Examiner*—Edward J. Wojciechowicz
*Attorney, Agent, or Firm*—Cushman, Darby & Cushman

[57] ABSTRACT

Principal faces of semiconductor devices (19) are bonded by means of a bond layer (17) on one face (lower face) of a heat-resistive flexible synthetic resin film (8, 16), for example, polyimide film, the other face (upper face) of the heat-resistive flexible synthetic resin film (8, 16) has bonded wiring conductor films (22) of a specified wiring pattern, and specified parts of electrode metal layers (20) or specified regions (66, 67) on the principal face of the semiconductor devices (19) and specified parts of the wiring conductor films (22) on the resin film (8, 16) are connected by conductor films (22) formed extending between them through through-holes with sloped wall (18, 18a, 32) formed on the resin film (18, 16). Also, a thin reinforcing frame (24) of a metal film, formed on said one (lower) face of the resin film (8, 16) with a specified pattern, may be connected to the wiring conductor films (22) through other through-holes (181) with sloped wall.

26 Claims, 34 Drawing Figures

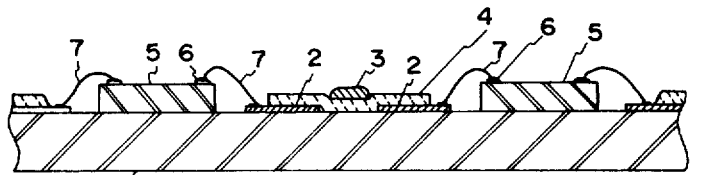
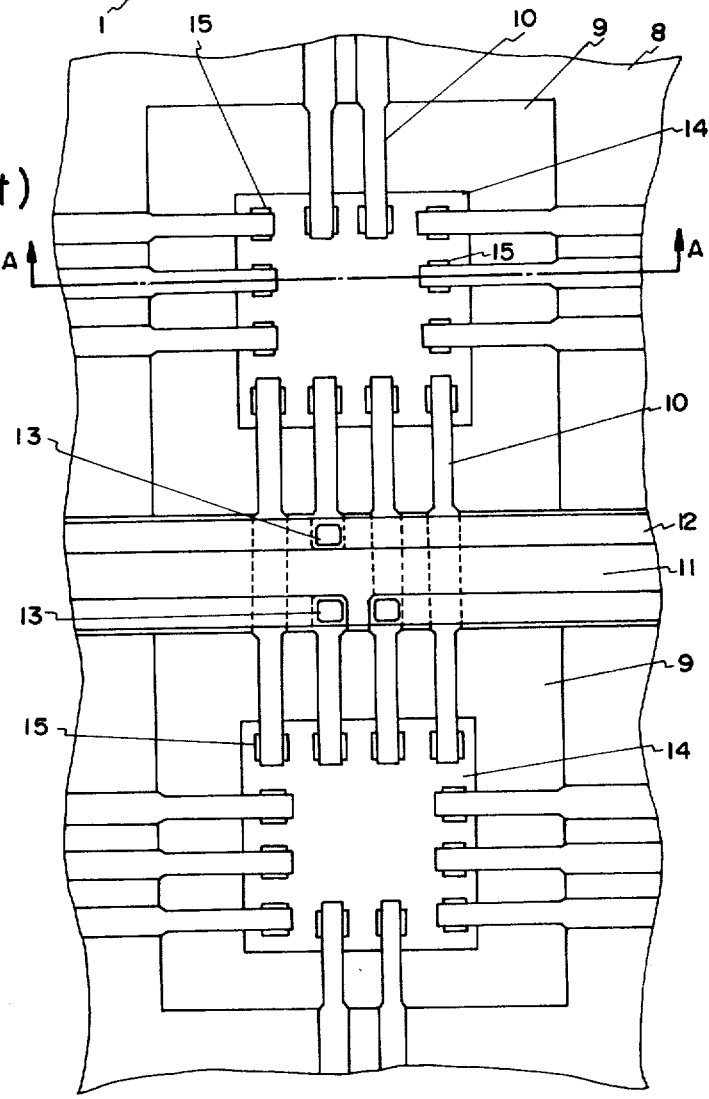

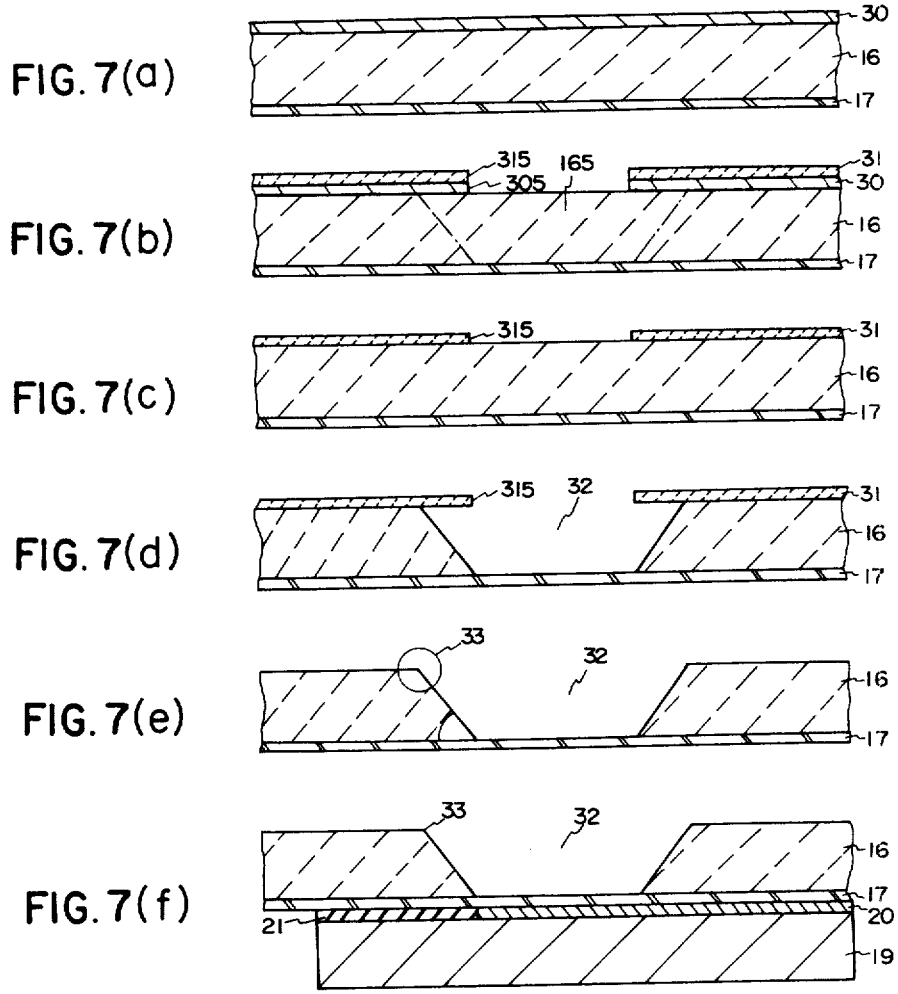

ELECTRONICS CIRCUIT DEVICE AND METHOD OF MAKING THE SAME

BACKGROUND OF THE INVENTION

1. Field of the Invention

The present invention relates to electronic circuit devices comprising at least one electronic device.

2. Description of the Prior Art

An example of known electronic circuit device comprising one or plural number of semiconductor device, such as integrated circuit (IC), is constructed as shown by FIG. 1, wherein multi-layered wiring conductor films 2 and 3 are formed by utilizing printing technology on one face of a ceramic substrate 1, the wiring conductors 2 and 3 are isolated by means of insulating layer 4 of for example $SiO_2$, a semiconductor devices 5,5 such as ICs are bonded on the semiconductor substrate 1, and electrodes 6,6 of the semiconductor devices 5,5 are connected to the wiring conductor 2 or 3 by fine aluminum wires 7 by known wire bonding technology. In such conventional example of FIG. 1, because of having many bonding points, and theses points being bonded one by one, the manufacture necessitates many steps and takes long time in the bonding of wires. Since the bonding of the wires 7,7 are made one point by one point, the reliability is not satisfactory. Since the ceramic substrate is expensive, the resultant device becomes expensive. Furthermore, in designing the ceramic substrate, the wiring conductor pattern and arrangement of the semiconductor devices 5,5 must be made so as to shorten the lengths of the bonding wires 7,7, and therefore by means of such restriction the substrate is likely to become large.

FIG. 2 shows another example of known electric circuit device comprising one or several of semiconductor devices, fabricated according to the film carrier technology; a representative of the film carrier technology is Mini-Mod (Trade Mark of General Electric Company of USA) technology. FIG. 3 shows a section of a part of the electronic circuit device at the sectional line A—A of FIG. 2. In the Mini-Mod technology, by simultaneously bonding many beam leads to the corresponding electrodes on semiconductor device, the electronic circuit device can be made without time taking sequential bondings. The beam leads are formed on a polyimide film by coating Cu film on the polyimide film and subsequently exercising a selective etching by photolithography, and electrodes of LSI are bonded thereon by thermal compression bonding. FIG. 2 shows a part of an electronic circuit device comprising several semiconductor devices 14,14 in accordance with the Mini-Mod technology applied to multi-tip LSI. In FIG. 2, a polyimide film 8 has a specified number of openings 9,9. Beam leads 10, . . . are made by utilizing etching technology in a manner to extend from the face of the polyimide film 8 into the openings 9,9, and the beam leads 10, . . . form parts of first wiring conductors. Then insulating layer 11 of a specified pattern is formed on the polyimide film 8 and on the first wiring conductors 10,10 and second wiring conductors 12, . . . are formed on the insulating layer 11. Specified ones of the first wiring conductors 10, . . . and the specified ones of the second wiring conductors 12, . . . are connected by metal films of a part of the second wiring conductors reaching to the first wiring conductors 10, . . . through the holes 13, . . . . In the openings 9,9, a semiconductor devices 14,14 are held by bonding the beam leads 10, . . onto the electrodes 15, . . . of the semiconductor devices 14,14.

The abovementioned Mini-Mod technology has a shortcoming that, when a large number of semiconductor devices 14, . . . are bonded to one polyimide film 8, a simultaneous bonding of them with high accuracy and high reliability is difficult, a jig to be used for the simultaneous bonding is complicated. Since the polyimide resin is very expensive, the conventional thick (about 125 $\mu$m) resin film 8 used in the Mini-Mod technology is very expensive. Since the wiring conductor is rather thick (about 35 $\mu$m) copper film, it is difficult to obtain a very fine pattern of the wiring conductor. Since the beam leads 10, . . . have lengths comparable with those of the fine wires in the wire-bonding technology, it is difficult to sufficiently minimize the substrate of polyimide film 8. Moreover, since the Mini-Mod technology requires the semiconductor device to have the electrodes arranged on the peripheral part thereof for bonding with the beam leads, the semiconductor device necessitates a special arrangement of the electrode pattern. Since the heat of the semiconductor device is transmitted only through the beam leads, heat dissipation of the device is not sufficient. Finally, the Mini-Mod technology is not suitable to install electronic devices heavier than the semiconductor device, since the weight of the device is supported only by the beam leads.

SUMMARY OF THE INVENTION

The object of the present invention is to increase the density of the wiring of an electronic circuit device and thereby to decrease its size. Another object of the present invention is to decrease the amount of the expensive material and number of steps of making the electronic circuit device.

BRIEF EXPLANATION OF THE DRAWINGS

FIG. 1 is a sectional elevation view of a part of one example of the conventional electronic circuit device made by known wire-bonding technology.

FIG. 2 is a plan view of a part of a device made by combining the Mini-Mod technology and known multi-layered wiring technology.

DETAILED DESCRIPTION OF PREFERRED EMBODIMENTS

Figure 4:
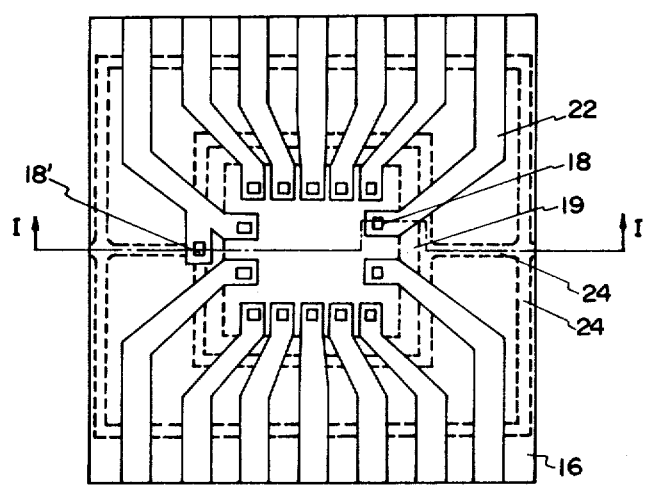
FIG. 4 is a plan view of an example of the electronic circuit device in accordance with the present invention.

Now, the present invention is described in details referring to the accompanying drawing FIG. 4 and thereafter showing various preferred embodiments of the present invention.

Figure 5:
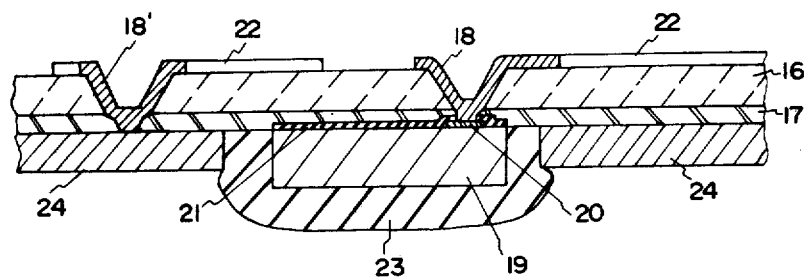
FIG. 5 is a sectional elevation view at the sectional plane I—I of FIG. 4.

A first example is elucidated referring to FIG. 4, which is a plan view of the first example, and FIG. 5 which is a sectional elevation view at the sectional line I—I of FIG. 4. In FIG. 4 and FIG. 5, numeral 16 designates a thin resin film of heat-resistive flexible synthetic resin. A preferred example is 10 μm to 50 μm thick polyimide film. Also, polyamide film or polyester film of the similar thickness can be used. On the lower face of the resin film 16, a bond layer 17 is formed. For the material of the bond layer 17, FEP (Fluorinated ethylene propylene) resin or epoxy resin is preferable. In this invention it is preferable to employ double- or triple-layered composite sheets consisting of polyimide film and FEP film marketed as KAPTON (Trade Mark) from E. I. du Pont de Nemouris and Company in the USA. For example, KAPTON has a construction of triple-layer of FEP(2.5μ)-polyimide(25 μm)-FEP(2.5μ). One face of the FEP layers are removed by etching to form the double layer for the invention. The thickness of the bond layer 17 is in the order from 1μ to 5μ and is desirable to be extremely thin. A Cu layer is formed by known deposition on the face of the resin film 16 and a wiring layer 22 of a specified pattern is formed by selectively etching the Cu layer by use of known photolithography. Holes on the resin film 16 are formed at specified position by known chemical etching with strong alkali solution. Further, holes on the bond layer 17 are formed by use of the plasma etching, thereby the through-holes 18, which penetrates both resin film 16 and the bond layer 17, are formed. In the forming of the through-holes 18, it is preferable to control the solution concentration, solution temperature and time, in order that walls of the through-holes 18 have slope with angle of 30°-60° against the axis of the holes 18. Semiconductor integrated circuit chip 19 has the electrodes 20 on one face thereof, and the parts of the face other than the electrodes 20 are covered by known ordinary protection layer 21 of $SiO_2$ formed by CVD (chemical vapor deposition).

The semiconductor device 19 is bonded and fixed by thermal pressing at 300° C.-350° C. on the bond layer 17 after the position adjustment of the electrodes 20 on the through-holes 18. Since the resin film 16 is thin and hence the resin film 16 is almost transparent, the position adjustment is easy. It is also quite efficient that a number of semiconductor devices 19 can be bonded at one time.

In the figure the top face of the resin film 16 has the wiring circuit pattern 22, and on the opposite face, namely on the lower face, several semiconductor devices 19, . . . are bonded by the layer of the bond 17. The wiring pattern layers are double layered metal layers consisting of underlying thin layer of Ti or Cr formed on the resin film 16 and the overlying thicker layer of Cu. The underlying layer of Cr or Ti serves as a contamination stopping barrier layer which prevents the overlying Cu from diffusing through the Al electrode layer 20 into the semiconductor device 19, and at the same time, the underlying Cr or Ti layer improves adhesion of the Cu wiring conductor 22 on the resin film 16. For one example, the double layered wiring conductors 22 are formed by known deposition with the temperature of the resin film 16 at 150°-250° C., (followed by) plating for increasing the thickness of the overlying Cu layer. In this invention, the deposition implies one method selected from evaporation, sputtering, non-electrolytic plating and ion-plating. Either one of the abovementioned methods can be used. Then the double layered conductor layer is selectively etched to form specified wiring pattern by utilizing known photolithography. This wiring pattern can be formed by use of a metal mask, if the high preciseness is not expected. At this stage, the wiring 22 and electrodes 20 of the semiconductor device 19 are connected by the double layered metal film formed in the through-holes 18 extending continuously from the wiring conductor 22 to the part contacting on the electrodes 20. A protection coating layer 23 for the semiconductor device 19 may be formed with silicone resin, epoxy resin or with metal when a heat sink on heat dissipation is considered. This coating layer 23 might not be necessary for some cases. A reinforcing supporter 24 to support the film 16 is formed on the lower face of the resin film 16, namely on the face opposite to that having the wiring conductor 22. The reinforcing supporter 24 consists of metal frame, for example, and it is bonded around the device 19 by means of a bonding layer 17. The necessity of the taper for the wall of through-hole comes when an electrical connection by use of the through-hole 18 is made between the pattern wiring 22 and some other parts. Namely the sloped wall having larger diameter of the through-hole at the upper face of wiring 22 than that at the opposite (lower) face of the resin film 16 enables forming of thicker and more reliable metal film by deposition and plating in and peripheral part of the through holes 18. If the slope of the taper is steep, shadow problem arises at the forming of the metal film, and also gap problem at the subsequent plating. On the contrary, if the slope of the through-hole is too gentle, the diameter at the face of the wiring conductor 22 becomes too large, thereby causing connection problem with the neighboring through-hole.

In the practical example of the invention when the semiconductor devices 19 are bonded and fixed to the resin film 16, a number of semiconductor devices 19 can be bonded through the bond layer 17 at one time. Most convenient way of bonding is to pass the devices 19 through the heating furnace while applying even pressure to a number of devices 19 with a large pressure plate after adjusting the position of the semiconductors 19 by a simple jig. When the wiring conductor 22 is formed by the deposition, connections between the wiring conductors 22 and the electrodes 20 on the semiconductors 19 are formed through the through-holes 18.

According to the method of the present invention, the number of the process is considerably reduced in comparison with the abovementioned Mini-Mod technology, and reliability is also considerably improved.

Figure 3:
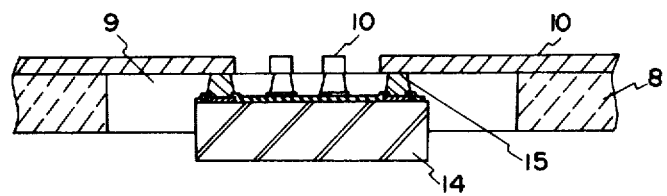
FIG. 3 is a sectional elevation view at the sectional plane A—A of FIG. 2.

In the Mini-Mod type process, a rather thick polyimide film 8 of about $12.5\mu$ has been usually employed as the film 8 of FIG. 2 and FIG. 3. This is because the film 8 itself needs strength to support fairly thick copper foil of $35\mu$ as a wiring conductor (first layer) and beam leads 10 on the surface of the polyimide film 8, and because the film has several large openings 9 for receiving the semiconductor device and still has to hold the semiconductor devices 9 with the beam leads 10 bonded thereon. In the example of the present invention shown in FIG. 4 and FIG. 5, the semiconductor devices 19 and resin film 16 are bonded face to face with the bonding layer 17 inbetween, and there are no large openings to spoil the strength in the film 16, and accordingly, the rather thin resin film 16 of $10\mu$–$50\mu$ is sufficient for this use. This enables the total thickness of the apparatus even thinner and material costs, which is mainly consisting of expensive polyimide film for the resin film 16, can be considerably reduced.

The wiring conductors 22 of the practical example of FIG. 4 and FIG. 5 are formed by the deposition and mostly followed by subsequent plating, and their thickness amounts to $2\mu$–$15\mu$. Copper-foil thickness in accordance with the Mini-Mod type process is so thick as $35\mu$, and so, the ruggedness of the surface on the first layer wiring conductor becomes large. Such rugged face of the Mini-Mod device cause a problem that at connection part with the second (overlying) layer wiring conductor 12, that is, at cross-over place of the second and first wiring conductors a cut-off is likely to occur. This has been a shortcoming of low reliability of the Mini-Mod device.

On the contrary, in the example of the present invention, the wiring conductors 22 need not support the weight of the semiconductor devices 19, and therefore, the wiring conductors 22 do not have the mechanical strength. Therefore, it is possible to form the wiring conductors 22 with thin metal films. Metal supporter for the reinforcement, i.e. metal frame 24 extends to peripheral parts of the resin film 16 as shown in FIG. 4. This is for the purpose to reinforce the resin film 16 and to prevent its warping. When the film area is large, the frame should preferably extends to the central parts to surround the periphery of the semiconductor device 19 as shown by FIG. 4.

If the metal frame 24 is so constructed as to surround the semiconductor device 19, this results not only to reinforce the resin film 16 but also has the effect as a stopper against spreading of melted resin slurry, which is preferably applied continuously to cover the semiconductor devices 19 and neighboring part to form a protection film 23. The thickness of the reinforcing metal frame 24 is preferably from $30\mu$ to $500\mu$, and preferable material of the metal frame 24 is Cu, stainless steel or Fe.

The selection of the material depends on the wiring material. For example, if the material for the wiring conductor 22 is Cu and wiring pattern is formed by the photolithography and etching, it is necessary to use the metal material such as stainless steel which is resistant to the $FeCl_3$ solution as the etching solution for the Cu wiring conductor 22.

When a slim metal frame is used as the metal frame 24, bubbles are not trapped between the film 16 and the metal frame 24 at the bonding process, and the bonding is very strong. Also the slim frame can be easily soldered onto the printed circuit board in a short time, because such slim frame does not has unnecessarily large heat capacity.

Figure 6:
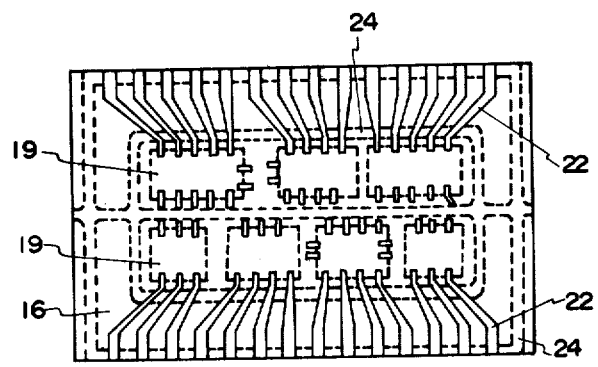
FIG. 6 is a plan view of another example of the electronic circuit device, which has the similar structure with that of FIG. 4 but comprising more semiconductor devices, in accordance with the present invention.

FIG. 6 shows a modified example of the invention, wherein more than one semiconductor device 19 are on the resin film 16 while basic structure is similar to that of FIG. 4 and FIG. 5. In this case same effects as ellucidated for the case of FIG. 4 and FIG. 5 can also be expected.

As the supporter 24, insulation resin, ceramic, etc. are also usable.

As described above, in FIG. 4, FIG. 5 and FIG. 6, more than one semiconductor device are bonded and fixed on one of the faces of the heat resistive and flexible resin film 16 through the bond layer 17. Multi-layered wiring can be formed on the face which is opposite to that having semiconductor devices thereon. Electrodes 20 of the semiconductor devices 19 and specified parts of the wiring conductors 22 are electrically connected by means of the metal films formed on the wall of the sloped through-holes 18. This process provides extremely thin and reliable IC devices on mass production line with reduced working processes. The invented process has the advantages that the material cost is cheap and large integration can be possible by increasing the wiring density.

In FIG. 4 and FIG. 5, resin film substrate 16, which alone per se is not easy to handle, can be made thinner and easy to handle by combining with the supporter 24.

Especially, when electrical measurement is conducted or the electronic circuit device of this example is fixed to the printed circuit board, efficiency for the working is improved, and hence total costs reduction is possible. This factor largely contributes to the semiconductor device assemblying by the wireless bonding. Moreover, by means of the stopping action against melted coating resin the structure of the present invention with the reinforcing frame makes it possible to produce the electronic circuit device with more uniform quality when the resin coating on the semiconductor is employed.

According to the investigation of the inventors, when the wiring 22 is formed on the insulating film by the evaporation, if peripheral parts of the through-hole 18 in the film 16 has sharp corner, electrical cut-off is likely to occur. To overcome this shortcoming, an acute angle of the peripheral part around the through-hole 18 is changed to the gentle periphery and the cut-off is avoided. The method to remove the acute edge corner at the pherical place of the through-hole 18 is explained referring to various steps of FIG. 7 which shows sectional elevation view of various steps of the through-hole part of the resin film 16.

Figure 7G:
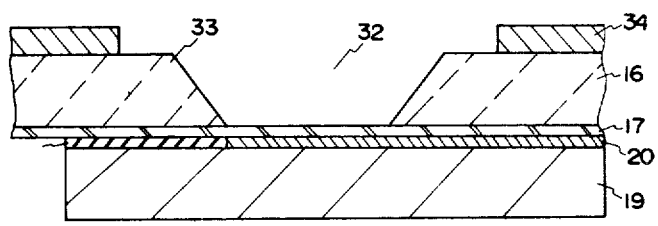
In FIG. 7, (a) to (i) are sectional elevation views illustrating various steps of making method of one example of electronic circuit device in accordance with the present invention.

At first, by known method, a photoresist mask 31 of a specified pattern having an opening 315 is formed on the resin film 16 as shown by FIG. 7(c). Then, the part of the resin film 16 which is exposed through the opening 315 is selectively removed by known etching method to form a through-hole 32 as shown by FIG. 7(d).

The etchant for this process is preferably alkali solution, as typical one, NaOH. The through-hole 32 can be formed by etching for about 10-15 minutes for the resin film 16 of 25μ thickness. And the diameter of the through-hole should be about 100μ for the semiconductor ICs. FEP film 17 remains after the etching, since it is not soluble to alkali. The wall of the through-hole 32 should preferably have the angle of 30° to 60° against the face of the resin film 16.

In case, a resin film 16 marketed with a coating of thin metal film (for example, 2-20μ Cu or Ni) as shown by FIG. 7(a) is used as a starting material, then a photoresist film 31 of a specified pattern is to be formed on the thin metal film 30. Subsequently, the metal film 30 is etched by utilizing a photoresist mask 31 formed thereon to form an opening 305. Then, the resin film 16 at the part 165 exposed from the opening 305 is etched away by known art in the similar manner to the case shown by FIG. 7(d).

After the above process, the photo-resist film 31 (and metal film 30 too, in the case of FIG. 7(a) and FIG. (b)) is removed as shown by FIG. 7(e).

Corner 33 of the periphery of the through-hole 32 has an acute edge in section and this is liable to the electrical cut-off of the wiring metal film formed later on it. Therefore, this acute corner 33 is preferably changed to a round gentle corner in the later stage.

Then the semiconductor device 19 is bonded to the FEP film 17, a bond layer, which is on the opposite face to the through-hole 32 with respect to the resin film 16 as shown in FIG. 7(f). Al wirings 20 have been formed on the bonded surface of the semiconductor device 19 prior to the bonding. The semiconductor device 19 is bonded to the FEP film 16 by applying the pressure at about 300° C.

Figure 7H:
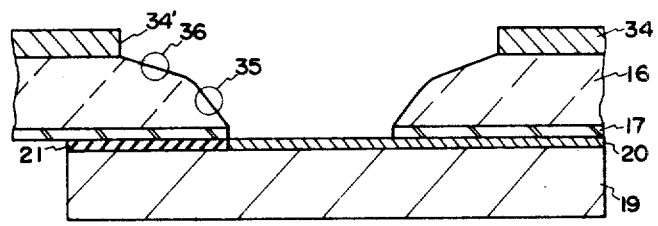
Figure 7I:
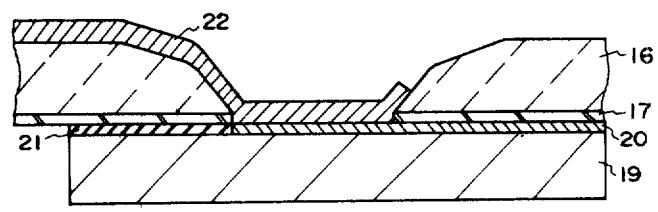

Next, a metal mask 34, for masking specified part against an oxide plasma etching, is formed on the polyimide film 16. The aperture 34' of the mask 34 is formed to be a little wider than the diameter of the upper end part of the previously formed through-hole 32. This mask is adherent fixed after position-adjustment with the through-hole 32. The suitable material for the mask 34 is stainless steel which is oxidation resistive, and the suitable thickness is 30μ-300μ, depending on the diameter. Then, a plasma etching process follows. If the resin film 16 is sufficiently thick, the plasma-etching can be made without the use of the mask 34. There are two objects for this plasma etching process. One object is to remove the part of the bonding layer 17 of FEP film exposed at the bottom of the through-hole 32. The other object is to make the slope of the peripheral part of the through hole 32 gentler and thereby make the corner round. FIG. 7(h) shows the condition that after the removal of the exposed part of the bonding layer 17. As a result of the plasma etching, the tapered wall of the through-hole 32 now has two parts, a lower and steeper part 35 and the upper and gentler part, and therefore, the peripheral corner of the through-hole become rounded.

In this masked plasma etching, the requisite condition is that the metal mask 34 is wider than through-hole 32 and it is important to select suitable velocity of etching by the oxygen plasma. Even if the hole 32 is not through-holed remaining a thin layer of the resin film 16, at the bottom of the hole 32, the remaining thin part can be removed by the oxygen plasma etching process. Accordingly, it is not important whether the hole 32 is a through-hole or a bottomed hole.

Finally the metal mask 34 is removed by known process, and a metal wiring film 22 is selectively formed on the specified part of the surface of the exposed electrode 20 of the semiconductor 19 and on the tapered wall 35, 36 of the through-hole 32 in the polyimide film 16, by deposition and/or plating process to attain a desired thickness. The wiring film 22 makes an electrical connection between the electrodes 20 of the semiconductor device 19 and wiring film 22. A double layered film consisting of underlying Cr or Ti layer and overlying Cu layer is suitable for the metal film 22.

In the above method, after forming hole 32 with tapered wall by selectively etching the resin film 16, the semiconductor device 19 is bonded on the bond layer 17, which is a layer of the double-layered resin film 16. The part of the bond layer exposed at the bottom of the hole 32 and the part of the film 16 around periphery of the hole are removed to round the peripheral edge of the hole. By removing the part of the bonding layer 17 and rounding the peripheral edge of the tapered wall of the hole, cut-off of the metal wiring 22 for external connection of the semiconductor device 19 can be prevented, and therefore fabrication of the electronic cifcuit device with high reliability is obtainable.

Referring to FIG. 8, fabricating method of the electronic circuit device comprising the frame 24, more than one semiconductor device 19 and other electronic parts is explained in the following. As shown in FIG. 8(a), at first a resin film 16, as a resin substrate having a bond layer 17 on the lower face thereof is bonded to the supporter 24 having large through-holes 40. As described above, the typical material for the resin film 16 is polyimide film, for the bonding layer 17 FEP, for the supporter 24 metal such as copper, iron, stainless steel, nickel, etc., or thick polyimide film or ceramic substrate, respectively. For the heat dissipation effect with cheap costs, suitable material is iron or copper. FIG. 8(b) shows the state after the bonding. The preferable thickness of the polyimide film 16 is 15μ-50μ, that of the FEP 17 2.5μ-12.5μ, that of the supporter 24 100μ-500μ, respectively. The through-holes 40 formed on the supporter 24 may be as the same size with the semiconductor devices or passive parts to be bonded and fixed later, but the hole size is preferably to be a little larger than those semiconductor devices and passive parts in order to make the insertion of the parts easy. Then as shown in FIG. 8(c) through-holes 32 for the wiring are formed on the resin film 16 just like the process of FIG. 7(c). The places of the through-holes 32 for fixing the device shall coincide the positions of electrode parts of the semiconductor devices and passive parts. Forming method of the through-hole 32 is known plasma etching or chemical etching.

Figure 8A:
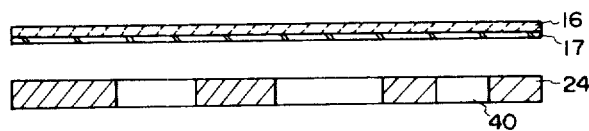
In FIG. 8, (a) to (f) are sectional elevation views illustrating various steps of one example of making method of another example of electronic circuit device in accordance with the present invention.
Figure 8B:
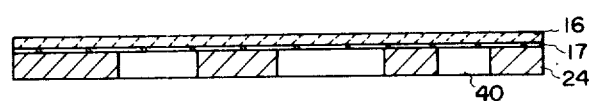
Figure 8C:
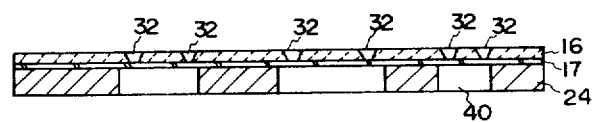
Figure 8D:
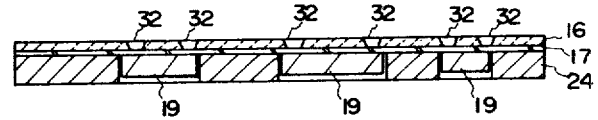

Subsequently, several devices 19, . . . are bonded to the bonding layer 17 after inserting them into the through-hole 40 as shown in FIG. 8(d). Position adjustment is automatically established to fix the devices using the through-holes 40 formed on the supporter 24 as guide means. Process of forming the through holes 32 for fixing and that of the bonding the devices must not necessarily be proceeded in this order.

Figure 8E:
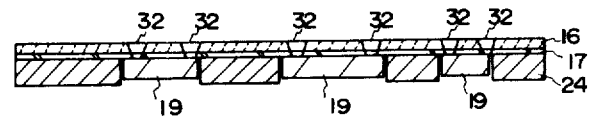
Figure 8F:
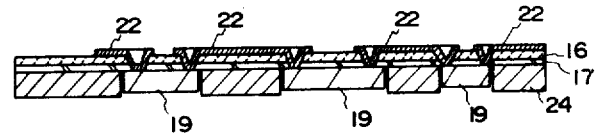

Then the FEP bond layer 17 exposed at the bottom of the fixing hole 32 is removed by the plasma etch process to form the device of FIG. 8(e). This process is not always necessary if the plasma etch is already used in the above-mentioned step of forming the through-holes 40. However if the chemical etching is employed in the process of forming the through-holes 40, the FEP (bond layer) 17 remains at the bottom of the through-holes 32, since the FEP layer 17 is stable against chemicals, and hence the plasma etching process is necessary to fulfill the wiring condition. Electrode wirings 22, . . . from the electrodes of several devices 19, . . . are formed in the hole 32 as shown by FIG. 8(f).

According to the abovementioned process, electrode wirings 22, . . . can be formed after bonding the electronic parts such as devices 19, . . . on the resin substrate 16. This means that electrode wirings of all electronic parts can be efficiently carried out at one time and position adjustment of several devices is easily and correctly done by utilizing the supporter 24 as a jig for the insertion.

Figure 9:
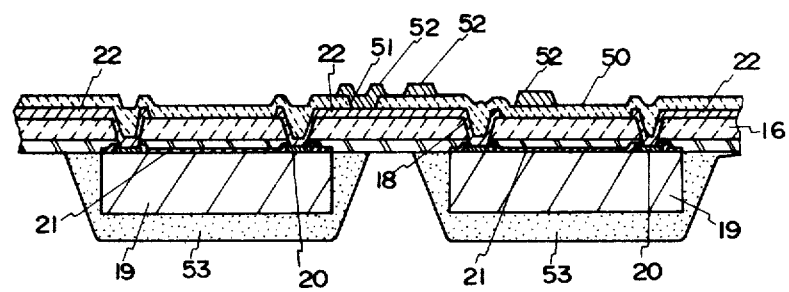
FIG. 9 is a sectional elevation view of another example of electronic circuit device in accordance with the present invention.

FIG. 9 illustrates another example of the invention, where the wirings 22 of the film 16 are of multi-layered construction, which is elucidated in the following. In this example an insulating layer 50 is formed on a first layer wirings 22 by use of a solution of polyimide resin or Parylene (Trade mark of the Union Carbide Corporation), and a contact opening 51 is formed by selectively etching the layer 50. A second layer wirings 52 are formed by the similar method for the first layer wirings on the insulation layer 50, and are consisting of Cu, Ni, Al, Au, etc. The second layer wirings 52 and first layer wirings 22 are connected through the openings 51 on the insulation layer 50, the openings being formed at the cross points of the first and the second wirings.

A protection layers 53 formed at the back face of the devices 19, 19 are not always necessary. Large integration is easily established by use of the multi-layered wiring structure described above, as examples of the invention.

Figure 10:
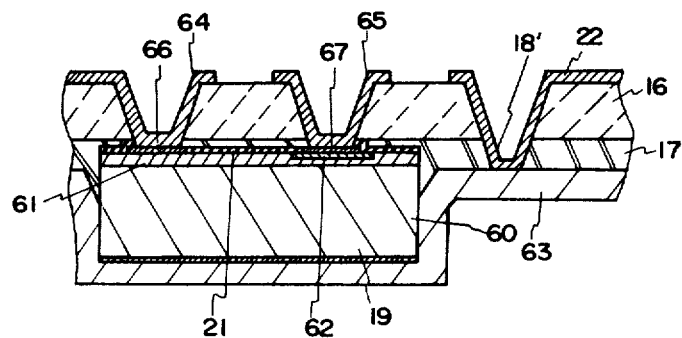
FIG. 10 is a sectional elevation view of still another example of electronic circuit device in accordance with the present invention.

Another example is shown by FIG. 10, wherein a transistor 19 is employed as a semiconductor device 19 and a collector region 60 of the transistor 19 is connected to the wiring conductor 22 and a metal film 63 through a through-hole 18'. The transistor 19 has the collector region 60 on the lower part, the base region 61 and the emitter region 62 on the upper part. And the collector region 60 is connected to the wiring conductor 22 by a metal film 63 which is formed to cover the lower face of the transistor 19 and extends to underneath part of the through-hole 18' under the bonding layer 17, and further to the wiring conductor 22 through the through-hole 18'. The electrode 66 of the base region 61 and the electrode 67 of the emitter region 62 are connected by the metal films 64 and 65 formed in the through-holes to specified wiring conductors on the upper face of the film 16. The connecting metal films 22, 64 and 65 are formed at the same time. In this example, wireless bonding is also applicable for such semiconductor devices that has electrode metal films on both sides thereof. The electrode 63 is extended away to the bonding layer 17 and hence can be used for a heat dissipating means. This is convenient when employing some power devices as the semiconductor device 19. This electrode 63 also serves as a wiring conductor since it is connected with the wiring conductor 22 by means of a metal film through another through-hole 18'.

Figure 11A:
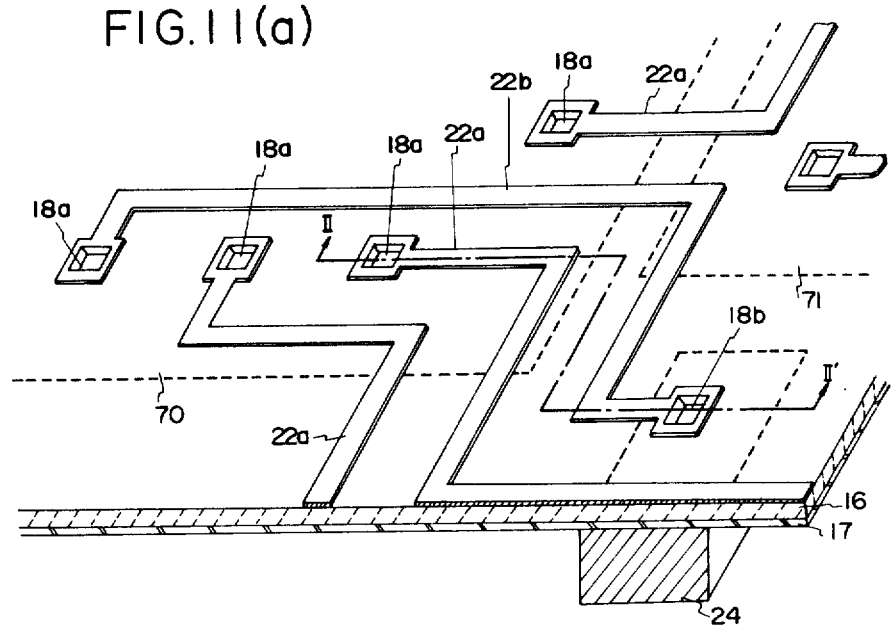
FIG. 11(a) is a fragmental perspective view of another example of the electronic circuit device in accordance with the present invention.
Figure 11B:
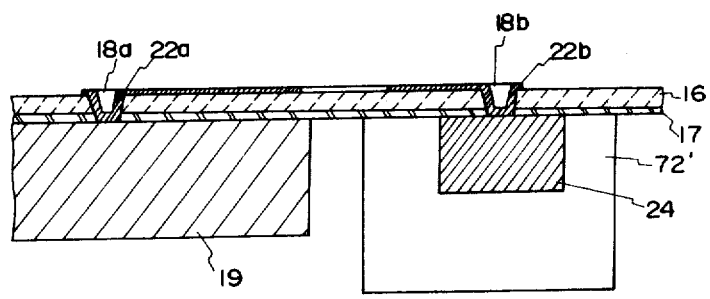
FIG. 11(b) is a sectional elevation view at the section plane II—II of FIG. 11(a).

Another example is explained referring to FIG. 11(a) and FIG. 11(b), wherein a metal frame 24 provided as a reinforcing supporter is also used as another wiring conductor on the back face. Wiring conductors 22a and 22b of specified conductor are formed by deposition on a resin film 16. The conductor 22a is connected to the semiconductor device 19 by through-holes 18a. The wiring conductor 22b is electrically connected to the suitable place of a reinforcing metal supporting frame 24 at the back face of the film 16 by a through-hole 18b formed at the predetermined part of the film 16. In this structure the frame 24 can be used as the wiring conductor, and this leads to attainment of a larger density of integration. Within the regions shown by the broken lines 70 and 71 of FIG. 11(a), a semiconductor device 19 and other electronic parts 72' are bonded and fixed, respectively. When a number of electric parts are bonded and fixed on the resin film 16, installation in a large-integration scale is possible in the structure of FIG. 11, where the metal frame 24 for the reinforcing supporter can be used as the wiring conductor of a multilayered wiring structure. In this multi-layered wiring structure, the connection of the reinforcing supporter 24 and wiring pattern 22 is carried out by the through-holes 18a at the same time with the forming of the deposition wiring conductors 22(a) and 22(b), so the structure can correctly be realized without repeating several deposition etchings.

Figure 12A:
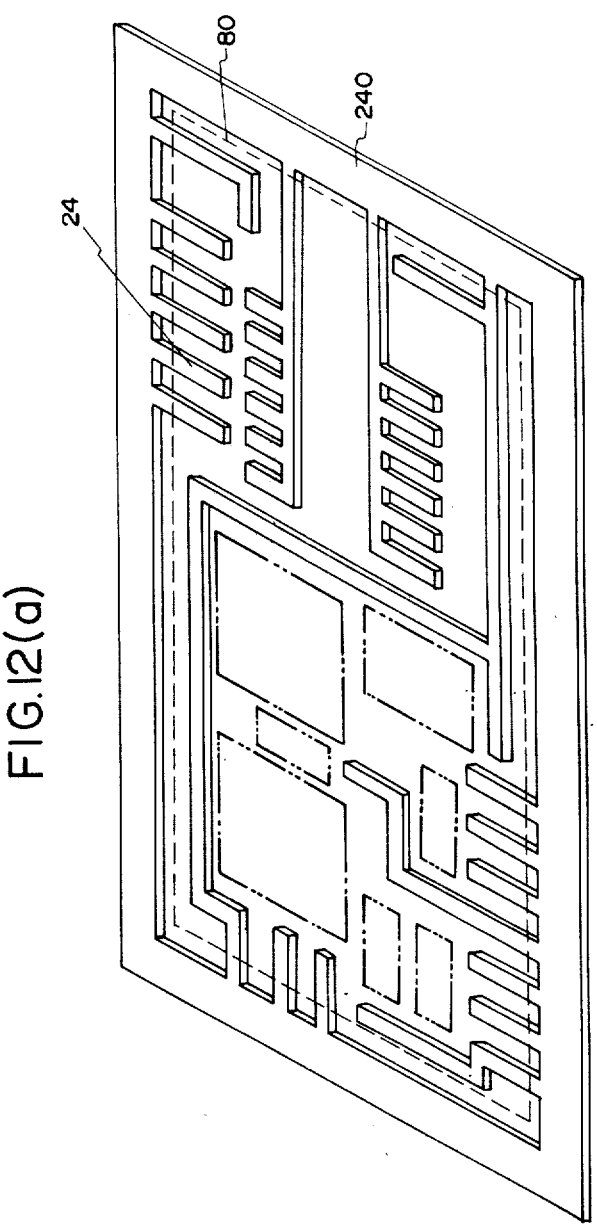
FIG. 12(a) is a perspective view of one example of metal frame to be used as a reinforcing metal frame bonded onto a face of heat-resistive and flexible synthetic resing film.
Figure 12B:
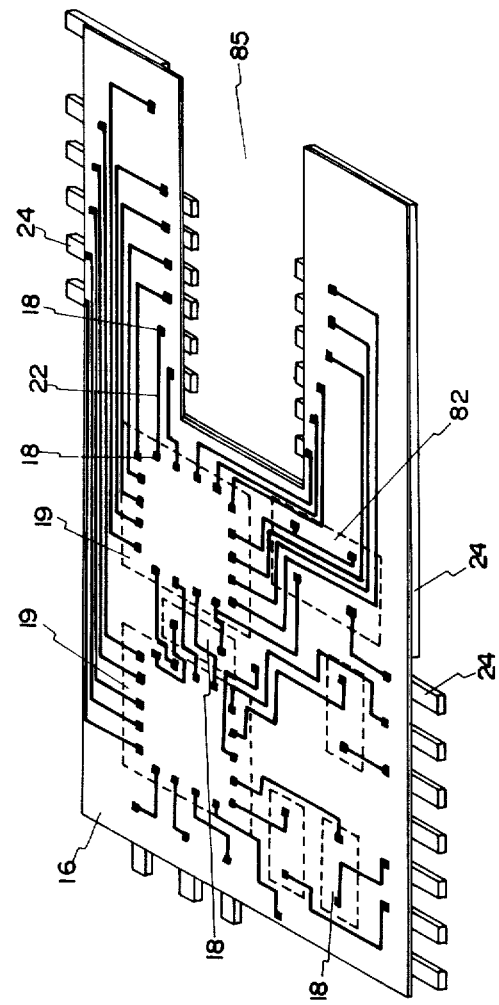
FIG. 12(b) is a perspective view of the heat-resistive and flexible synthetic resin film with the metal frame of FIG. 12(a) bonded onto the under face of the resin film.
Figure 12C:
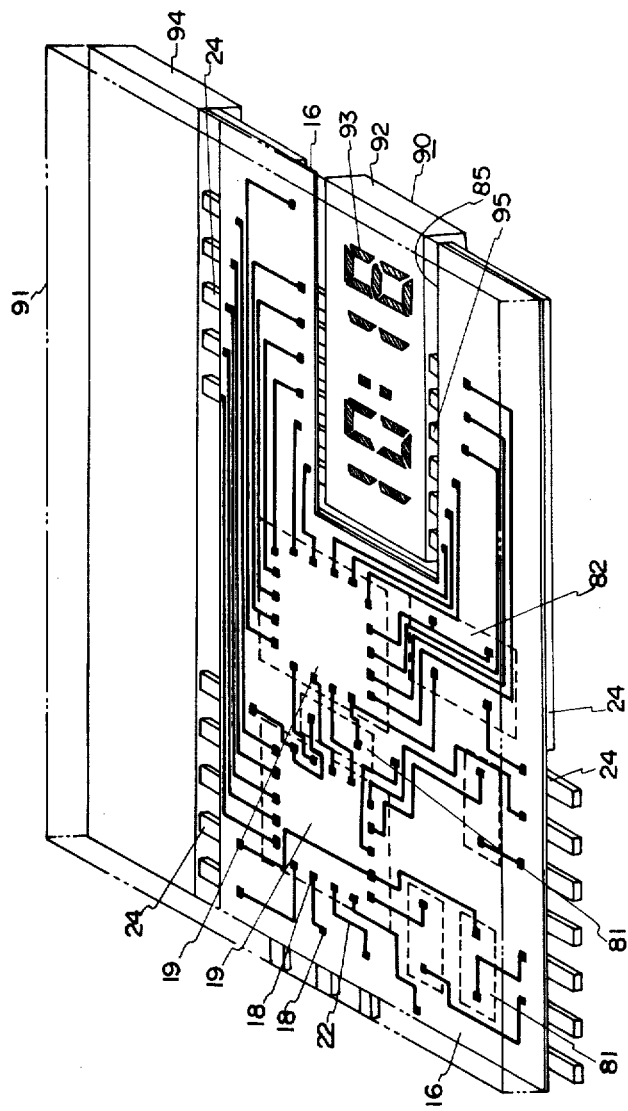
FIG. 12(c) is a perspective view of semi-manufactured assembly comprising the resin film of FIG. 12(b) and a time indicating device, but showing its overlying glass plate only with chain lines.

A concrete example fabricated by the structure of FIG. 11(a) and FIG. 11(b) are explained referring to FIG. 12(a), FIG. 12(b) and FIG. 12(c). FIG. 12(c) shows a thin electronic circuit apparatus (applied to a making of a liquid crystal indicator) provided with a number of electronic parts with high density. FIG. 12(a) and FIG. 12(b) illustrate the steps in production process.

FIG. 12(a) shows a framed supporter 240 where many metal frames 24 are formed in a square peripheral frame. A part of the supporter that is inside the region shown by broken lines 80 is bonded on the back face of a resin film 16, and the frames 24, to be used as wiring conductors, are subsequently separated into several parts, as shown by FIG. 12(b) by cutting off the peripheral square part 240 (of FIG. 12(a)) of the frame. Electronic parts are to be installed on the back face of the resin film 16 at the position shown by broken lines.

FIG. 12(b) shows the state, where the reinforcing frame 24 is bonded on the back face of the resin film 16. In FIG. 12(b), the electronic parts, semiconductor device 19 such as LSI, a chip resistor 81 and a chip capacitor 82 are bonded on the same principal face (lower face) of the resin film 16, to which face the frame 24 has been bonded.

In the following, the production process up to the state of FIG. 12(b) is explained. On one of the principal faces (lower face) of a polyimide film 16 of 10 $\mu$m-50 $\mu$m is installed a bond layer 17 of FEP resin or epoxy resin.

Supporter frame 24 of about 150$\mu$ thick shown in FIG. 12(a) of nickel, stainless steel or Kovar (alloy of Fe-Ni-Co) are bonded by pressing at a raised temperature of about 300° C.

The expansion coefficient of the insulating resin film 16 is larger than that of the supporting metal frame 24, and so, the insulating resin film 16 shrinks when its temperature comes back to the room temperature after the bonding process. This enables to obtain a taut resin film surface, and this is a quite important factor for the following process.

By selectively etchings the specified places by the chemical etching and plasma etching, a preset number of through-holes 18 having sloped walls are formed in the insulating resin film 16 and the underlying bond layer 17. The semiconductor device 19 and chip resistor 81 are pressed at a raised temperature on the bond layer 17. The insulating resin film 16 and the bond layer 17 of the substrate is transparent, and hence, the position adjustment of the through-hole 18 with the electrodes of the semiconductor device 19 is easy to carry out. The thickness of the reinforcing supporter 24 amounts to 50 $\mu$m–250 $\mu$m. It is desirable to be thick on the grounds of the mechanical strength. When the electronic parts such as semiconductor device 19 and the reinforcing supporter 24 lie on the same side of the bond layer 17 like the abovementioned example, it is desirable for the sake of working process that the thickness of the reinforcing supporter 24 is thinner than that of electronic parts.

Cr or Ti and Cu to form the wiring conductors 22 in the later stage are continuously vapor-deposited (in the same vacuum state) in deposition on all the way of the face of the insulating resin film 16 which face is opposite to the face of supporter fixing. Subsequently, if a thicker wiring conductor is necessary, plating treatment follows. In this stage electrodes of the semiconductor device 19, terminals of a chip resistor 81 and some parts of the supporters 24 are connected to the CVD formed metal conductors through the through-holes 18 and 18'. Then a specified wiring pattern 22 is formed by etching unnecessary parts of the deposition metal film by known photochemical etching process. The preferable width of each of the wiring conductors 22 of the wiring pattern is about 75 $\mu$m and the preferable average separation width is 75 $\mu$m.

Though the present example utilizes deposition to connect the conductors on the front face and back face of the insulating resin film 16 through the through-holes 18 and 18', other means of connection, for example, soldering, use of conductive paste, or non-electrolytic plating is also acceptable.

According to the present invention, as ellucidated in the above, the multi-layered wiring structure is easily obtainable with considerably few steps, since the electric connection across both sides of the resin film 16 can be made simultaneously with forming of the wiring conductor film.

The thickness of the supporting frame 24 can be extremely thin to stand under the mechanical force, by originally shaping it in a form having a fairly wide square peripheral frame 240 at the most external part as shown by FIG. 12(a). This leads to easy and safe handling. At the end of the production process, the frame is cut at the broken line 80, for example, as shown by FIG. 12(b), to form the finished resin film sheet with wiring conductor and reinforcing supporter.

As clearly seen from the drawing, parts of the reinforcing supporter 24 extend outwards from the insulating resin film 16, and they can be used as outward terminals of the apparatus, since it is connected with the wiring pattern 22 through the through-holes. The apparatus obtains humidity resistance if a coating film of silicon rubber is formed at the side of the electronic devices.

In the above example, the reinforcing supporter 24 serves as the reinforcing frame at the production time and thereafter, and also parts of it can be used for the wiring. This fact indicates that a multi-layered wiring, which is indispensable to the case when a number of semiconductor devices 19 are used, and resultant-large scale integration are easily realizable. For the multi-layered structure, the connection between the layers of different levels are made through the through-holes 18 at the same time when the evaporation layer is formed on one face the insulating resin film 16. This forming is easily and correctly carried out without changing pattern masks several times, or without repeating the deposition and etching.

The reinforcing supporter 24 are firmly bonded in a complicated form on one face of the insulating resin film 16 after they are cut out from the frame, and so the supporter of the finished apparatus shown by FIG. 12(b) has enough strength, and it hardly bend or break in handling. It is also quite practical that a part of the reinforcing supporter 24 serves as outward terminals of the apparatus.

FIG. 12(c) shows the case that a liquid crystal indicator 90, which consists of the principal glass plate 90 and a larger overlaying glass plate 91 (shown by chain line) is installed in a manner that the principal glass plate 92 is received in the cut place 85 of the resin film 16 shown in FIG. 12(b). The overlying glass plate 91 has transparent electrodes for numeral indication over the place where the liquid crystal segments 93 are disposed on the underlying glass substrate 92, and the liquid crystal segments 93 are sealed between two glass plates 91 and 92. The resin film 16 is bonded on the lower face of the glass plate 91. Another glass plate 94 (shown by chain line), which constitutes another liquid crystal indicator together with overlying glass plate 91, is also installed to the resin film 16. The liquid crystal indication panel 92 can be fixed at the cut place 85 of the resin film 16, by connecting and fixing the electrode 95 formed on the glass substrate 92 and the conductor-supporter 24 with solder, conductive past, etc.

The apparatus of this example is characterized in that the electronic devices are installed on one (lower) face of the thin resin film 16, the wiring pattern 22 is formed on the other (upper) face of the resin film 16, the connection between them is established through the through-hole 18 formed in the resin film 16, the metal supporter 24 is formed on at least one face of the film 16, part of the supporter is used for wiring or lead terminals, and hence the multi-layered wiring is realized with a thin finished thickness of several hundred $\mu$m.

Thus it becomes possible to fabricate the electronic circuit apparatus including the liquid crystal to be compact and thin, by connecting the reinforcing frame 24 with several electrodes 95 of the liquid crystal element 90 on the glass substrate 92 for the liquid crystal. It is also easy to handle the device on the resin film 16, since it hardly break, and therefore it is not necessary to seal it in a ceramic package in the conventional way.

The apparatus of the abovementioned example only occupy an area as large as the total area of the electronic devices, namely total of the semiconductor device 19 and chip resistors 81, and hence, is quite small comparing with the concentional electronic circuit devices using a ceramic package in the conventional way, and further it does not cost much.

The liquid crystal indication device 90 and the devices on the resin film 16 are connected and fixed by the flexible metal films of lead terminals 95 and 24, and therefore, thermal expansion and shrinkage of these devices do not give unnecessary distortion by the strain to these device, unlike the prior art. In the prior art using a ceramic package for the electronic circuit part, a glass substrate holding the indicating device and the ceramic package are overlapped, and electrodes on the bottom face of the ceramic package are connected on the electrodes on the glass substrate. In such conventional device, the deformation force due to the difference of thermal expansion coefficients of glass and ceramic, applies to the connection place directly, and this causes troubles such as removal of the wiring connection, cut-off, imperfection of the wiring, etc. In the abovementioned practical example, such troubles at the connection places hardly arise on the structural grounds, and the reliability is high.

In the practical example of FIG. 12, the supporter 24 is formed only on one of the faces of the insulating resin film 16, but this supporter 24 can be formed on both faces. Namely, a bonding layer 17 such as FEP resin can be formed on both faces of an insulating resin film 16, and a reinforcing supporter 24 of nickel is bonded on the back face (lower face).

On the other hand on the front face (upper face) a thin copper foil is pressed and bonded all the way on the front face. And etching is carried out to retain a specified pattern for the upper face supporter. Then the upper-face bonding layer of the parts other than covered by the retained upper supporting face are removed by plasma etching.

The subsequent processes after making of through-holes 78 are similar to the foregoing examples.

Partial photo etching is also applicable and precise wiring pattern is obtainable.

Therefore it is possible to realize an installation with a higher density.

The apparatus of FIG. 12(c) comprises the resin film 16, the frame 17, which reinforces the insulating resin film 16 formed on one of or both of the faces of the insulating resin film 16, electronic devices such as LSI, fixed on one principal face of the substrate, and the wiring layer selectively formed with a specified pattern on the other face of the resin film 16. Specified terminals of the electronic devices and wiring layers are connected through the through-hole formed in the insulating resin film 16.

Also, specified terminals of the electronic devices or the wiring layer are connected to specified parts of the supporter.

This connection method reduces the production costs by using the quite thin substrate, and assures the sufficient strength.

Moreover, multi-layered wiring structure can easily be formed and it is possible to install the electronic parts with a higher density.

Figure 13:
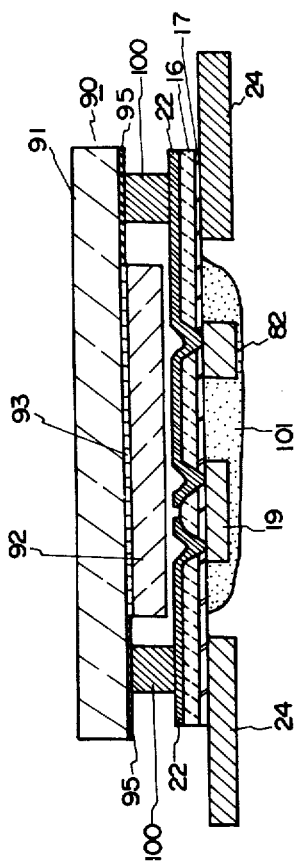
FIG. 13 is a sectional elevation view of another example, comprising a liquid crystal indicator, of the present invention.

FIG. 13 shows another installation example using a liquid crystal indication panel. Therein, an electrodes 95 on one (lower) face of the glass substrates 91 of the liquid crystal indication device and a wiring conductors 22 on a film 16 are electrically connected with each other by an elastic connector 100, for example, conductive rubber. Speaking to further details, the resin film 16 is positioned below the liquid crystal device 90, and the device 90 and the film 16 are pressed and fixed by a spring (not shown) to each other, and electrically connected through the elastic connector 100 disposed inbetween, and thereby the electrical connection is made by the elastic connector 100 between the electrodes 95 on the glass plate 90 and the wiring conductors 22 on the film 16.

The thickness in total of the finished whole part of the apparatus can be made 2–3 mm, which is only slightly thicker than the one of FIG. 12, but the apparatus of this example is easy to assemble or dismantle it, since the electrical connection is made by the elastic connector 100.

The device of FIG. 13 is installed, for example, at a cut (indent) place of a printed substrate (not shown) and electrically connected by supporters 24 with a printed substrate. An insulating resin layer 101 is for protecting the back face of devices 19 and 82 against humidity or contaminating gas.

Figure 14:
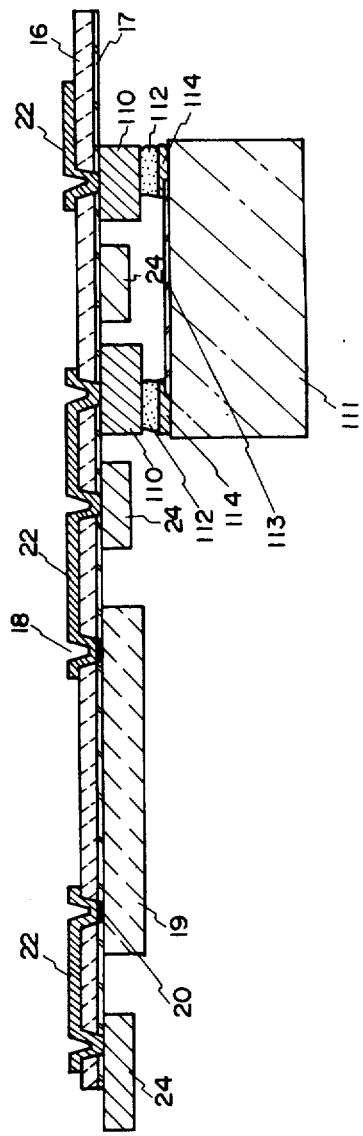
FIG. 14 is a sectional elevation view of another example of the present invention.

Another example of the invention is shown by FIG. 14. A semiconductor device 19 and other kind of electronic device 111 are fixed on the same face of a resin film 16 through a bonding layer 17, and their electric connections to the wiring conductors 22 are made by connecting the terminals of the semiconductor device 19 and the electronic parts 111 through a metal film formed through through-holes formed on the film 16. The forming of the metal film through the through-holes is made during forming process of the wiring pattern on the resin film 16. If the electrodes of chip resistors of electronic parts are dip-soldered, the solder is likely to flow from the through-holes of the resin film 16 and make the wiring conductors 22 electrically shorted, during the while the temperature of the device is raised at 250° C.–350° C. in the later process of thermally fixing the electronic parts on a bonding layer 17.

This problem can be overcome by employing a modified structure shown by FIG. 14, wherein the electronic device 19 and metal blocks 110, for example, gold plated Ni or Au plated Ni or Au plated Cu, are bonded on the bond-layer 17, and the larger parts 111 are soldered to the metal blocks 110 by use of the solder layer 112. The metal blocks 110 are selected to have the nature of easy and stable bonding on the bond layer 17. By use of such metal block 110 between the electrodes 114 of the electronic parts 111 and the extended part of the metal film 22 formed through the through-holes 18, it is prevented that the solder 112 flows up through the through-hole 18 to the wiring conductor 22. In this structure the metal blocks 110 can be well bonded with electronic parts, even for some kind of electronic parts that have difficulty to be bonded to the bond layer 17, and a strong installation is possible. If necessary, the electrode 114 of the chip resistor can be fixed to the reinforcing supporter 24 by soldering.

Finally, the invention is explained for the example that is an application to an apparatus of flip-chip type in the wireless bonding process. The present invention is also effective to the application for the flip-chip type device.

Figure 15A:
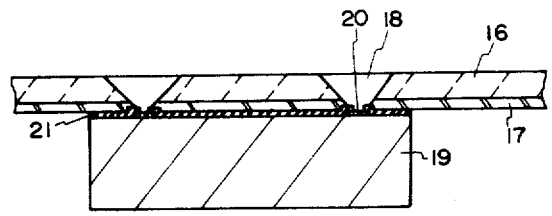
In FIG. 15, (a) to (d) are sectional side views showing various steps of making method of another example of a semiconductor device in accordance with the present invention.

As shown by FIG. 15(a), a semiconductor device 19 is bonded on the bond layer 17 which is bonded on one face of the resin film 16 with several through-holes 18. The semi-conductor device 19 is so disposed that specified electrodes 20 thereof meets predetermined corresponding through-holes 18.

Figure 15B:
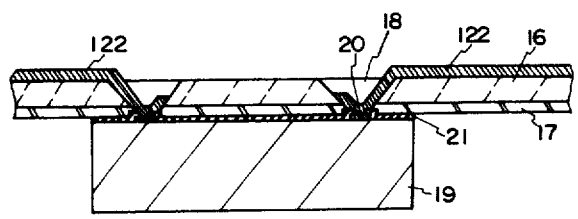
Figure 15C:
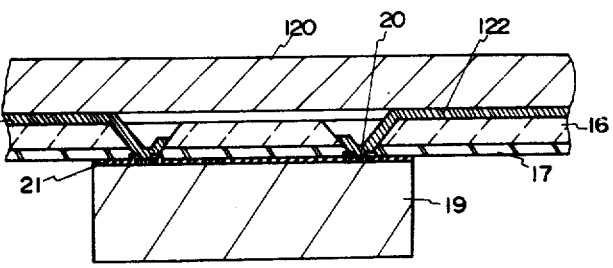

After forming conductive wirings 122 of specified pattern on the resin film 16 as shown by FIG. 15(b), whole face of the resin film 16 is covered by a metal plate 120 as shown by FIG. 15(c).

Then, utilizing the semiconductor device 19 as an etching mask, a plasma etching is carried out by a plasma emanating upward, so as to remove the film 16 and the bond layer 17 which are not covered by the semiconductor device 19. The wiring metal layers 122 are retained after the plasma etching, and therefore, external connecting lead wires 122, which are extending outward from the device are formed as shown by FIG. 15(d).

In the method of FIG. 15, etchings of the resin film 16 and bond layer 17 are carried out by using the semi-conductor device 19 as a mask to make the external lead wires 122. Thus, the process of the etchings to form the external lead and to remove the films 16 and layer 17 can be simplified. Moreover, since the semiconductor device 19 itself is used as the etching mask, the size and shape of the retained resin film 16 and the bond layer 17 has accurate size, which is the same with or smaller than that of the semiconductor device 19. Therefore, the size of the finished device can be used as a very compact IC with external connection electrodes.

Figure 15D:
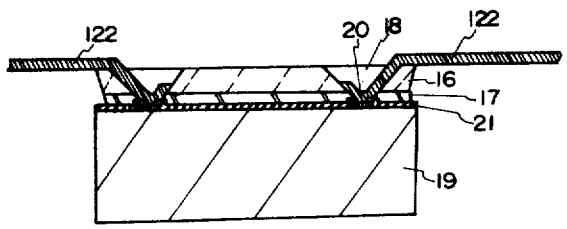

According to the structure of FIG. 15(d), the ordinary type semiconductor device is usable, and there is no use of forming bump on pad.

What we claim is:

1. An electronic circuit device comprising a resin film of heat-resistive and flexible synthetic resin having wiring conductors of a specified pattern on one face thereof, at least one semiconductor device held on said resin film, characterized in that said semiconductor device is secured bonding its principal face by means of a bond layer on the other face of said resin film, said resin film has a reinforcing frame formed on said other face and a specified number of through-holes with sloped wall thereby said through-hole having the larger diameter on said one face of the resin film and its smaller diameter on said other face of said resin film and, specified electrodes on said principal face of said semi-conductor device are connected to specified parts of said wiring conductors by means of metal films formed through said through-holes with sloped wall.

2. An electronic circuit device of claim 1, further characterized in that said reinforcing frame is made of a metal and is electrically connected to said wiring conductor through at least a through-hole with sloped wall with its larger diameter on said one face of the resin film and its smaller diameter on said other face of the resin film.

3. An electronic circuit device of claim 1, further characterized in that the reinforcing frame is formed to surround said semiconductor device.

4. An electronic circuit device of claim 1, further characterized in that at least one other electric part is bonded by means of a bond layer on said the other face of said resin film, and specified electrodes of said electric part are connected to specified part of said wiring conductors by means of metal films formed through through-holes with sloped wall formed on said resin film.

5. An electronic circuit device of claim 1, further characterized in that at least one other electric part is electrically connected to conductors on the resin film through at least one elastic conductor.

6. An electronic circuit device of claim 1, further characterized in that said resin has at least one block of conductor, to which at least one other electric part is electrically and mechanically connected.

7. An electronic circuit device of claim 1, further characterized in that said resin film has over said wiring conductors at least another wiring conductor with insulating layer disposed inbetween.

8. An electronic circuit device of claim 1, further characterized in that at least one other wiring conductor is formed extending from the opposite face of said semi-conductor device to said the other face of said resin film, and said one other wiring conductor is connected to said wiring conductors by means of metal films formed through through-holes with sloped wall formed on said resin film.

9. An electronic circuit device of claim 1, further characterized in that said semiconductor device is covered by a protecting layer.

10. An electronic circuit device of claim 1, further characterized in that said bond layer is one selected from the group consisting of fluorinated ethylene propylene and epoxy resin.

11. An electronic circuit device of claim 1, further characterized in that said resin film is one selected from the group consisting of polyimide film, polyamide film and polyester film.

12. An electronic circuit device of claim 11, further characterized in that said reinforcing frame is made of a metal and is electrically connected to said wiring conductor through at least a through-hole with sloped wall with its larger diameter on said one face of the resin film and its smaller diameter on said other face of the resin film.

13. An electronic circuit device of claim 11, further characterized in that the reinforcing frame is formed to surround said semiconductor device.

14. An electronic circuit device of claim 11, further characterized in that at least one other electric part is bonded by means of a bond layer on said the other face of said resin film, and specified electrodes of said electric part are connected to specified part of said wiring conductors by means of metal films formed through through-holes with sloped wall formed on said resin film.

15. An electronic circuit device of claim 11, further characterized in that at least one other electric part is electrically connected to conductors on the resin film through at least one elastic conductors.

16. An electronic circuit device of claim 11, further characterized in that said resin has at least one block of conductor to which at least one other electric part is electrically and mechanically connected.

17. An electronic circuit device of claim 11, further characterized in that said resin film has over said wiring conductors at least another wiring conductor with insulating layer disposed inbetween.

18. An electronic circuit device of claim 11, further characterized in that at least one other wiring conductor is formed extending from the opposite face of said semiconductor device to said the other face of said resin film, and said one other wiring conductor is connected to said wiring conductors by means of metal films formed through through-holes with sloped wall formed on said resin film.

19. An electronic circuit device of claim 11, further characterized in that said semiconductor device is covered by a protecting layer.

20. An electronic circuit device of claim 11, further characterized in that said bond layer is one selected from the group consisting of fluorinated ethylene propylene and epoxy resin.

21. An electronic circuit device of claim 2, further characterized in that a liquid crystal indicator is coupled to said resin film in a manner that its electrodes are connected to specified parts of said reinforcing frame.

22. An electronic circuit device of claim 5, further characterized in that at least one of said other electric part is a liquid crystal indicator having connecting means comprising elastic conductors.

23. An electronic circuit device comprising:
a resin film of heat-resistive and flexible synthetic resin having at least one semiconductor device, principal face of which having electrodes, are bonded on one face of said resin film by a bond layer disposed inbetween,
said resin film having specified number of wiring conductors on said the other face,
said resin film and said bond layer having a specified number of common through-holes,
characterized in that
each of said through-holes having sloped wall in a manner to have larger diameter on said the other face of said resin film and smaller diameter on said bond layer,
said resin film has external lead conductors formed on said the other face thereof, said external lead conductors extending from specified positions on said resin film passing periphery of said resin film and outward by a specified length and being connected to specified electrodes of said semiconductor device by metal films formed through said through-holes.

24. An electronic circuit device comprising a resin film of heat-resistive and flexible synthetic resin having wiring conductors of a specified pattern on one face thereof, at least one electronic device held on said resin film, characterized in that said electronic device is secured bonding its principal face by means of a bond layer on the other face of said resin film, said resin film has a reinforcing frame formed on said other face and a specified number of through-holes with sloped wall thereby said through-hole having the larger diameter on said one face of the resin film and its smaller diameter on said other face of said resin film and, specified electrodes on said principal face of said electronic device are connected to specified parts of said wiring conductors by means of metal films formed through said through-holes with sloped wall.

25. An electronic circuit device of claim 24, further characterized in that said resin film is one selected from the group consisting of polyimide film, polyamide film and polyester film.

26. An electronic circuit device of claim 25, further characterized in that said bond layer is one selected from the group consisting of fluorinated ethylene propylene and epoxy resin.

* * * * *